United States Patent [19]

Usami

[11] 3,978,248

[45] Aug. 31, 1976

[54] METHOD FOR MANUFACTURING COMPOSITE SINTERED STRUCTURE

[75] Inventor: Tamotsu Usami, Yamanashi, Japan

[73] Assignee: Hitachi, Ltd., Japan

[22] Filed: Jan. 10, 1974

[21] Appl. No.: 432,428

Related U.S. Application Data

[63] Continuation-in-part of Ser. Nos. 209,093, Dec. 17, 1971, abandoned, and Ser. No. 331,035, Feb. 9, 1973, abandoned.

[30] Foreign Application Priority Data

Dec. 18, 1970  Japan.............................. 45-113026
Feb. 9, 1972  Japan................................ 47-13610

[52] U.S. Cl.................................. 427/96; 427/123; 427/125; 427/126; 427/376; 427/383
[51] Int. Cl.²........................................ B05D 5/12
[58] Field of Search ........... 117/201, 215, 217, 221, 117/22, 21; 75/208 R; 29/182.2; 427/58, 96, 123, 125, 126, 376, 383

[56] References Cited
UNITED STATES PATENTS

| | | |
|---|---|---|
| 3,189,978 | 6/1965 | Stetson .............................. 29/155.5 |
| 3,241,995 | 3/1966 | Pulfrich et al. ......................... 117/22 |
| 3,423,517 | 1/1969 | Arrhenius .......................... 156/89 X |
| 3,615,981 | 10/1971 | Prah, Jr. et al. ...................... 156/89 |
| 3,768,144 | 10/1973 | Heinss.................................. 29/432 |
| 3,770,529 | 11/1973 | Anderson.......................... 156/89 X |

*Primary Examiner*—Cameron K. Weiffenbach
*Attorney, Agent, or Firm*—Craig & Antonelli

[57] ABSTRACT

A method for manufacturing a composite sintered structure, comprising the steps of preparing a green ceramic sheet, printing a green ceramic insulator paste and a conductor paste on the green ceramic sheet, and sintering the resulting lamination to form a monolithic structure, the green ceramic sheet and the insulator and conductor pastes being made of the same starting ceramic base materials, so that the difference in the coefficient of shrinkage between the green ceramic sheet and the printed insulator and conductor layers is eliminated.

19 Claims, 14 Drawing Figures

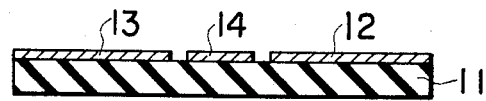
FIG. 3A
FIG. 3B
FIG. 3C
FIG. 4
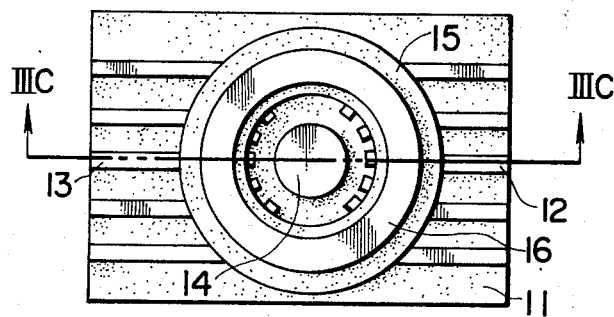
FIG. 5
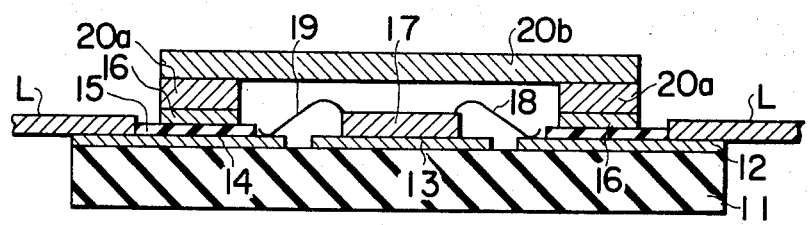
FIG. 6
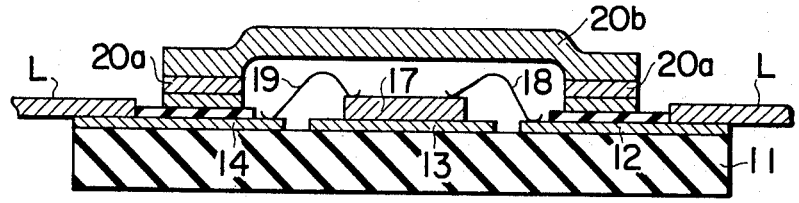
FIG. 7
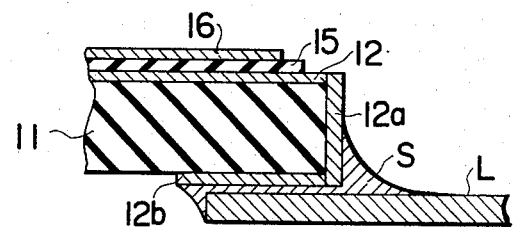

METHOD FOR MANUFACTURING COMPOSITE SINTERED STRUCTURE

CROSS REFERENCES

This is a continuation-in-part of my co-pending applications, Ser. No. 209,093, filed Dec. 17, 1971, entitled "METHOD FOR MANUFACTURING PRINTED CERAMIC SUBSTRATES", now abandoned, and Ser. No. 331,035, filed Feb. 9, 1973, entitled "METHOD FOR MANUFACTURING COMPOSITE SINTERED STRUCTURE", now abandoned.

BACKGROUND OF THE INVENTION

1. Field of the Invention

The present invention relates to an improved method for manufacturing a composite sintered structure. More particularly, it relates to a method for manufacturing a composite sintered structure comprising a plurality of conductive and insulative layers and for use in, for example, an integrated semiconductor circuit device.

2. Description of the Prior Art

Multilayer structures manufactured by stacking several ceramic sheets each of which has conductive patterns thereon and sintering the stack to form a unitary structure are generally known. As described by Stetson, U.S. Pat. No. 3,189,978, conductive layers of desired patterns are printed on the surfaces of green ceramic sheets formed separately, respectively. Holes are formed in desired interconnection portions of the respective substrates and the respective holes are filled with conductor material. The resultant sheets are stacked into a laminated body so that the conductive layers may have desired interconnections.

Then, the stack is sintered to obtain a multilayer structure, such as multilayer interconnection substrate or a multilayer interconnection package.

With such prior art technique, there are various disadvantages such that the holes for interconnections are sometimes not fully filled with conductive material, resulting in disconnection among conductive layers formed on the different sheets, such that since relatively thick ceramic sheets are used, the number of conductive layers to be stacked is limited.

In order to eliminate such disadvantages of the stacked ceramic sheet technique, it is proposed by Hargis, U.S. Pat. No. 3,549,784, to screen-print insulative and conductive material alternatively on a ceramic body. According to the art, since very thin insulative and conductive layers are printed, the thickness of the completed ceramic structure is extremely reduced and therefore the number of the conductive layers are increased. Also, the conductive layers printed on the different insulative layer planes are connected with the printed conductive layers without discontinuity.

In the screen printing technique, however, there occurs a problem of deformation of the final ceramic structure because of differences of the shrinkage rates among ceramic base, ceramic and metallic pastes. In order to avoid such deformation, it is proposed by Hargis, U.S. Pat. No. 3,549,784 that to provide on the reverse of the ceramic base a metallic layer which has an area and thickness similar to the metallic layer or layers printed on the reverse of the ceramic base. This resolution requires, however, additional printing steps, resulting in increase of manufacturing cost, and increase of the thickness of the final ceramic structure.

SUMMARY OF THE INVENTION

An object of the present invention is to provide a method for manufacturing a composite sintered structure free from distortion of the ceramic structure, which might be caused by the difference in the coefficient of shrinkage among a ceramic body, and printed insulative and conductive materials.

Another object is to provide printing pastes which are identical in the coefficient of shrinkage with a green ceramic sheet to be employed for a composite sintered structure.

A further object is to provide a method for manufacturing a composite ceramic structure which is made extremely thin, thereby eliminating waste of material.

A still further object is to provide a method for manufacturing a small-sized composite sintered structure which has a sealed construction free from leakage due to imperfect airtightness, unnecessary distortions of substrates, and which has a comparatively high endurance.

One of the embodiments of the present invention for accomplishing the above objects consists in a method for manufacturing a composite sintered structure wherein a green ceramic insulator paste and/or a conductor paste are deposited on a green ceramic sheet in the form of a single layer or a plurality of layers and wherein the materials are simultaneously sintered to form a unitary body, the method being characterized in that the green ceramic sheet and the respective pastes consist of an inorganic powdered ceramic material and a binder, both the ceramic material and the binder being the same materials between the sheet and the pastes, and in that the mixing ratio in the green ceramic sheet between the inorganic powdered ceramic material and the binder is equal to that ratio used in each paste between the inorganic powdered ceramic material and the binder.

Another embodiment consists in a method for manufacturing a composite sintered structure wherein a green ceramic paste and/or a conductor paste are deposited on a green ceramic sheet in the form of a single layer or a plurality of layers and wherein the materials are simultaneously sintered to form a unitary body, the method being characterized in that a mixture containing an inorganic powdered ceramic material, a binder and a solvent is prepared, that the green ceramic sheet is made of the mixture, and that the above-mentioned mixture or a mixture obtained by substituting only the solvent contained in the above-mentioned mixture by a solvent easy to be deposited on the sheet is employed as the green ceramic paste and the conductor paste containing a conductor powder.

According to the present invention, materials are selected and the mixing proportions are set so that no difference may occur in the shrinkage of the green ceramic sheet and the printed layers at the sintering. An excellent composite sintered structure free from exfoliation, disconnection and warp due to the different shrinkage can therefore be obtained.

The coefficients of shrinkage of the green ceramic sheet and the printed paste layers are determined by the materials, mixing portions, etc., of the inorganic powdered ceramic material such as alumina and the binder. In consequence, if the slip obtained with the same materials and equal mixing ratios and by the same mixing process is used for the sheet and the pastes, the control is facilitated more, and equal coefficients of shrinkage are exhibited at the sintering. Therefore, an excellent composite sintered structure is provided which is free from exfoliation, disconnection and flaw due to the difference in shrinkage.

Further according to the present invention, the interconnections of the wirings of the respective layers can be performed very easily. In addition, the respective layers are formed by the printing of the ceramic paste and the conductor paste, and the thicknesses of the layers can be controlled to be sufficiently thin.

BRIEF DESCRIPTION OF THE DRAWINGS

FIGS. 3A to 3C are sectional views showing various steps for manufacturing a printed ceramic substrate in accordance with this invention;

FIG. 4 is a plan view of the printed ceramic substrate manufactured in accordance with the steps of FIGS. 3A to 3C;

FIG. 5 is a sectional view of a packaged integrated circuit using a printed ceramic substrate in accordance with this invention;

FIG. 6 is a sectional view of another packaged integrated circuit using a printed ceramic substrate in accordance with this invention; and FIG. 7 is a sectional view of a portion of a printed ceramic substrate showing another method of connecting external leads in accordance with this invention;

DESCRIPTION OF THE PREFERRED EMBODIMENTS

Figure 1:
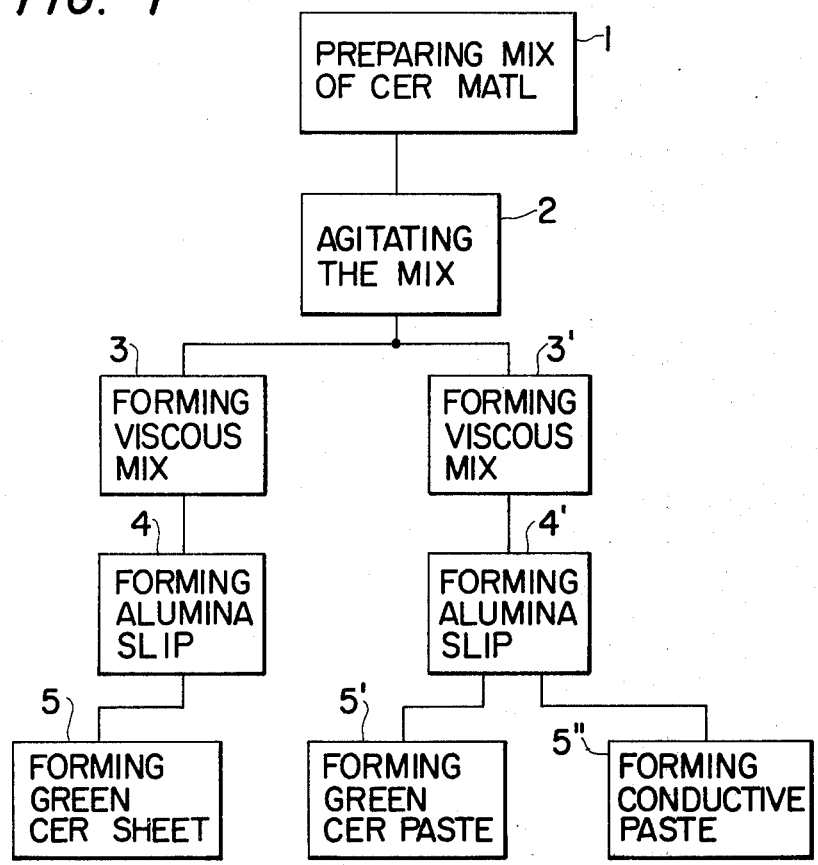
FIGS. 1 and 2 are block diagrams showing manufacturing processes for preparing ceramic sheets and insulative and conductive pastes according to the present invention.

FIG. 1 illustrates a manufacturing process according to the present invention. Various blocks each showing a step of manufacture will be hereinafter explained in detail:

1. As an inorganic ceramic material, a mixture is prepared which consists of alumina ($Al_2O_3$) as the principal constituent and powder of mineralizers such as silica ($SiO_2$) and magnesia ($MgO$). The proportions are, for example, 91 weight % of $Al_2O_3$, 6.8 weight % of $SiO_2$ and 2.2 weight % of $MgO$. As a binder for imparting a binding property to the mixture of the inorganic ceramic material, Butvar B–76 (trade name of Monsanto Co. for polyvinyl butyral) is added to the mixture. The sintering temperature can be suitably changed by the amounts of addition of the mineralizing agents. Generally, the amount of alumina varies from 88 to 95% by weight of the inorganic ceramic material.

2. The resulting mixture is agitated in a ball mill for about 30 minutes, thereby to obtain a powdered alumina mixture.

3. As a solvent for Butvar, there is prepared one adapted to readily form the mixture into a sheet (a low-boiling solvent), for example, an azeotropic mixture (consisting of 60 weight % of trichloro-ethylene, 23 weight % of butyl alcohol and 17 weight % of perchloro-ethylene). As a plasticizer for the green ceramic material, there is used butylphtalyl butylglycolate. These materials are added and mixed, along with Butvar, into the alumina powder mixture in the proportions of 6 grams of Butvar, 38 grams of the low-boiling solvent and 2.8 grams of the plasticizer for 100 grams of ceramic material (alumina + mineralizers).

4. The resulting viscous mixture is sufficiently agitated in a ball mill for 3 hours, thereby to obtain an alumina slip.

5. The alumina slip is cast onto a film of a resin, for example, Lumirror (trade name of Toyo-Rayon Co. for a polyester) of tetron film or exfoliation paper. Thus, a slip sheet of a fixed thickness (approximately 1.0 mm) and a desired shape is formed. Subsequently, the sheet-shaped slip is heated to volatilize the low-boiling solvent, and to be dried into the green ceramic sheet.

The blocks (3') to (5'') of FIG. 3 are directed to the steps used in the production of the green ceramic insulator paste as well as the conductor paste.

(3') Into the powdered alumina mixture produced at the step (2), there are added a solvent easy to print (high-boiling one), for example, butyl carbitol acetate as a solvent for Butvar, and a plasticizer for the green ceramic material, the same as used in step (3). The mixing proportions are 2.8 grams of the plasticizer and 38 grams of the high-boiling solvent for 106 grams of the alumina powder mixture.

(4') The resulting viscous mixture is sufficiently agitated in a ball mill for 3 hours, thereby to produce an alumina slip. The slip is divided into two parts.

(5') One of the alumina slip parts is made into the green ceramic paste for the insulating layer.

(5'') Conductor powder, for example, a powdery material of at least one of highly heat-resisting metals such as tungsten, molybdenum and titanium, is added and mixed into the other alumina slip part. In this manner, the conductor paste is produced. At this time, the resistance of the conductor material can be determined by controlling the quantity of the metal additive or additives.

The conductor paste and the insulating paste are printed on the green ceramic sheet each in the form of a single layer, or in the form of alternately laminated layers by, for example, the silk screen process. After each printing step, the paste is dried at 80°C.

The lamination of the green ceramic sheet and the printed pastes is heated to about 1,450° to about 1,650°C. in a reducing atmosphere of, e.g., a gaseous mixture of $N_2 + H_2$ or in an inert atmosphere of, e.g., $N_2$ gas. Then, the green ceramic sheet and the insulating paste are made ceramic, and therewith, the conductor paste is metallized. They are also thus sintered.

In the above particular embodiment, in case of forming the green ceramic sheet, the solvent adapted to be easily sheeted or spread out (the low-boiling solvent) is added into the alumina mixture. The reason for the use of the low-boiling solvent is that it volatilizes at the normal temperature, which is convenient for the sheeting work. Accordingly, the invention is in no way restricted thereto, but may also employ a high-boiling solvent. At this time, the plasticizer is simultaneously added in this embodiment in order to facilitate handling of the sheet. In the case of adding the high-boiling solvent, however, the separate addition of the plasticizer may be done away with in such way that the high-boiling solvent is caused to remain to some extent since it is difficult to volatilize away at the normal temperature, so as to utilize the remainder as the plasticizer.

Further, in case of forming the pastes, the solvent adapted to be readily printed (the high-boiling solvent)

is added to the alumina mixture. This is because the pasty state is held by the addition of the high-boiling solvent, so as to prevent the screen of a screen printing device from getting clogged at the printing. Accordingly, if the printing means is needed to be improved to solve the problem, a low-boiling solvent will also be employed.

Figure 2:
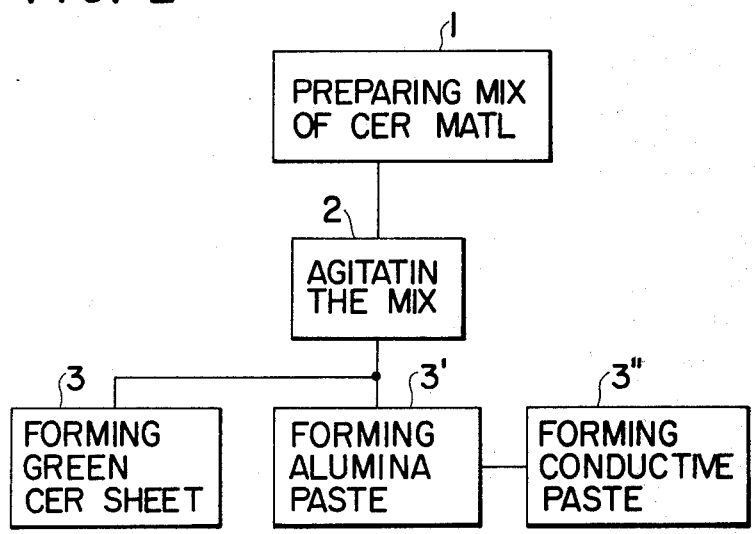

Another particular embodiment will now be described in conjunction with a manufacturing process illustrated in FIG. 2.

(1) As an inorganic ceramic material, a mixture is prepared which consists of alumina ($Al_2O_3$) as the principal constituent and powdery materials of mineralizers such as silica ($SiO_2$) and magnesia (MgO), the mixing proportions being, for example, 91 weight % of $Al_2O_3$, 6.8 weight % of $SiO_2$ and 2.2 weight % of MgO. The sintering temperature can be suitably changed by the amounts of addition of the mineralizers.

Butvar (trade name) is used as a binder for imparting a binding property to the inorganic ceramic material. A low-boiling solvent, for example, an azeotropic mixture (consisting of 60 weight % of trichloro-ethylene, 23 weight % of butyl alcohol and 17 weight % of perchloro-ethylene) is prepared as a solvent for Butvar. Butylphtalyl butylglycolate is used as a plasticizer for the green ceramic material. 6 grams of Butvar, 38 grams of the low-boiling solvent and 2.8 grams of the plasticizer are added and mixed into 100 grams of a ceramic material (alumina + mineralizers).

(2) The resulting mixture is sufficiently agitated in a ball mill for 3 hours, thereby to obtain an alumina slip.

(3) The alumina slip is cast onto a film of a resin, for example, Lumirror (trade name) or exfoliation paper, to form a green ceramic sheet having a fixed thickness (about 1.0 mm) and a desired shape. The green ceramic sheet is dried by being heated and thereby volatilizing away the low-boiling solvent.

(3') In case of using the alumina slip for the pastes, if it is not modified, the low-boiling solvent evaporates at the normal temperature and rapidly solidifies. As a result, clogging of the screen occurs at the printing, and cleaning of the screen after the printing is made difficult. Therefore, the low-boiling solvent is in a sense replaced by a high-boiling solvent, i.e., the low-boiling solvent is used to prepare slip for sheet and the higher boiling point solvent is added to slip containing low-boiling point solvent. For example, 120 grams of butyl carbitol acetate and 0.2 grams of silicone oil as a deforming agent (Toray Silicone SH 5520, trade name of Toray Co.) are added to 500 grams of the alumina slip. The alumina slip with the additives is subjected to vacuum heating (at a temperature of 80°–90°C. and under a pressure of $10^{-3}$ Torr), to pass off the low-boiling solvent. Thus, a paste is obtained.

The paste produced by the step (3') can be used as the insulating paste in that condition.

(3'') In order to produce the conductor paste, a powdery material of at least one of highly heat-resisting metals such as tungsten, molybdenum and titanium, is further added and mixed into the above paste. The resistance of the conductor material is determined by the quantity of the metal additive or additives. Generally from 50 to 70% by weight of the conductor paste is made of the metal additives.

A specific embodiment, in which the present invention is applied to a method for manufacturing a ceramic package, will now be described with reference to FIGS. 3A to 3C and FIG. 4.

A mixture of ceramic materials, a binder and a plasticizer is first prepared. The ingredients are as follows: 22.4 kg powdered $Al_2O_3$, 1.35 kg talc, 0.9 kg clay, 1.35 kg binder of, for example, Butvar B–76, 0.6 kg Flexol Plasticizer 3 GH (trade name of Union Carbide Corp.) as a plasticizer for the binder and 10 kg solvent for the binder, for example, a mixture of butyl alcohol, trichloroethylene and perchloro-ethylene in the volume ratio of 2.3:6:1.7.

The resulting mixture is agitated in a ball mill so as to form ceramic slip.

After milling is completed, a quantity of ceramic slip is spread upon a suitable support and a sheet is formed with a thickness of about 0.5 to 1.2 mm. The sheet is dried by being heated in air at a temperature of about 100°C. (max. 110°C.) for about 10 to 80 minutes. The resulting alumina sheet is flexible and this alumina sheet, which is not sintered, is called a green ceramic sheet or green sheet. In order to provide a substantially smooth film surface for printing metal or dielectric material by the well-known screen technique in the successive steps, the particle sizes or diameters of ceramic particles are selected to be, for example, in the range of about $0.1\mu$ to about $10\mu$, preferably, about $0.5\mu$ to about $5\mu$. The sheet thus obtained is used as the green ceramic base 11 as shown in FIG. 3A.

Then, another part of the above ceramic mixture is mixed with a solvent of n-butyl carbitol acetate and agitated to obtain an insulative paste. Further, a powdered metal such as Mo, Mn, W or mixture thereof is added to part of the insulative paste and agitated to obtain a conductive paste. The particle sizes of the metal powder are selected to be in the range of about $0.1\mu$ to about $10\mu$, preferably, to about $0.5\mu$ to about $5\mu$.

As shown in FIG. 3A, a quantity of the conductive paste is deposited or printed on the selected surface areas of the green ceramic base 11 to a thickness of about $10\mu$ to $20\mu$ by well-known screen printing technique using a silk screen or stainless steel mesh to form the interconnection layers 12, 13 and 14 conductive paste is dried in air for about 5 minutes at a temperature of about 100°C.

As shown in FIG. 3B, a quantity of the insulative paste is locally printed to a thickness of about 0.1 mm through a predetermined pattern so as to form the insulative layer 15 covering portions of the first conductive layers 12 and 13. Then, the insulative paste is dried in air for about 5 minutes at a temperature of about 100°C. Since the starting material of the insulative and conductive pastes for the layers 12 to 15 is derived from the same ceramic slip as that of the ceramic body 11, the occurrence of a distortion due to the difference of the thermal shrinkage rate during the following sintering, is prevented.

Referring to FIG. 3C a second conductive layer 16, is formed on a selected surface area of the green ceramic film 15, by printing the same conductive paste as that of the layers 12 to 14 to a thickness of about $20\mu$ and then drying it by heating in air for about 5 minutes at a temperature of 100°C.

Then, the whole assembly is heated for about 9 hours to a temperature of about 1,000° to 1,600°C. in a reducing atmosphere containing $H_2$ and $N_2$ or in an inert atmosphere containing only $N_2$ in order to sinter the green ceramic materials and the metal paste into a monolithic structure.

The green ceramic film 15 may be formed only on selected portions of the first metallic interconnection layers 12 and 13 which are printed on the green ceramic body 11 so as to prevent the first metallic layers 12 and 13 from contacting the second metallic layer 16 which is to be printed on the green ceramic film 15. The green ceramic film 15 is formed to have a sufficient thickness in order to prevent a short circuit between the upper and lower interconnection layers. Further green ceramic films and metallic interconnection layers can be formed by the repetition of the foregoing steps, thereby forming a printed ceramic substrate having multi-layer interconnections with high density.

As shown in FIG. 5, on the second metallic layer 16, formed on the green ceramic film 15, is placed metal ring 20a of about 1 mm thickness. For the material for the metal ring 20, any metal or alloy, which is usually used in the sealing of semiconductor devices such as Kovar (trade name), can be employed. External leads L of, for example, Kovar (trade name) are connected to the exposed portions of the metallic interconnection layers 12 and 14, respectively. The metal leads L and metal ring 20a are simultaneously fixed to the metallic layers 12, 14 and 20a with silver solder at a temperature of about 900°C. Then, a semiconductor chip 17 is mounted on the metal pad 13 by forming a gold-silicon utectic alloy therebetween. Electrodes of the semiconductor chip 17 are respectively connected to the exposed portions of the metallic interconnection layers 12 and 14 through connector wires 18 and 19. Finally, a metal plate 20b of, for example, Kovar (trade name) is fixed on the metal ring 20a by conventional electric welding, whereby the chip 17 is completely isolated or sealed from the outer atmosphere. Thus, the chip 17 is hermetically sealed by the metal plate and the printed substrate.

The metal plate 20b may be of a shape shown in FIG. 6. In this case the metal ring 20a is formed to a thickness of about 0.5 mm.

The external leads L may be provided on the bottom of the printed substrate as shown in FIG. 7. In this case metallic layers 12a and 12b of Mo or W are printed on the side and bottom surfaces of the green ceramic sheet 11 before sintering, and then metal lead L is soldered on the metallic layer 12b.

A method for forming a printed ceramic substrate having high density-multi-layer interconnections will be now given taking in conjunction with FIGS. 8A to 8E.

Figure 8A:
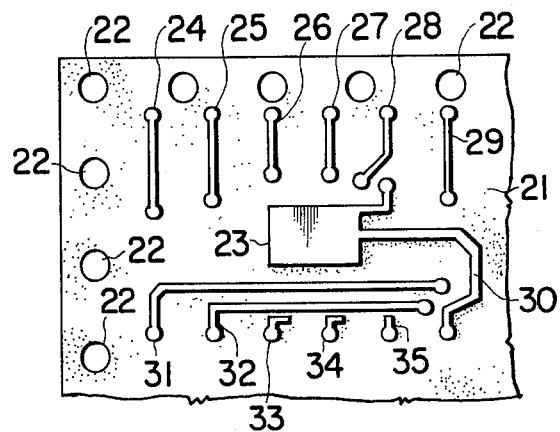
FIGS. 8A to 8E are plan views each showing successive steps for manufacturing a ceramic substrate having multi-layer interconnections in accordance with this invention.

A quantity of the alumina slip, which is prepared by the above-mentioned manner as described along with the steps (1) to (4) of FIG. 1, is spread upon a suitable support to a thickness of about 0.5 to 1.2 mm. Then the green ceramic sheet is heated in air for about 20 to 80 minutes at a temperature of 100°C. (max. of 110°C.) for drying, and is punched to form a substrate 21 of the green sheet having holes 22 for alignment as shown in FIG. 8A. The resulting dry sheet may be any conventional size.

On selected surface areas of the green sheet 21 are printed metallic interconnection layers 23 to 35. The metallic interconnection layers 23 to 35 are formed by printing a quantity of metal paste, which is prepared by the above-mentioned manner as described along with the steps (1) to (5″) of FIG. 1, to a thickness of about 10μ to 20μ by the well-known screen printing technique. The coated metal paste is dried in air for about 5 minutes at a temperature of 100°C. In FIG. 8A, reference numeral 23 designates a metallized portion on which a semiconductor chip (not shown) is to be mounted after sintering.

Figure 8B:
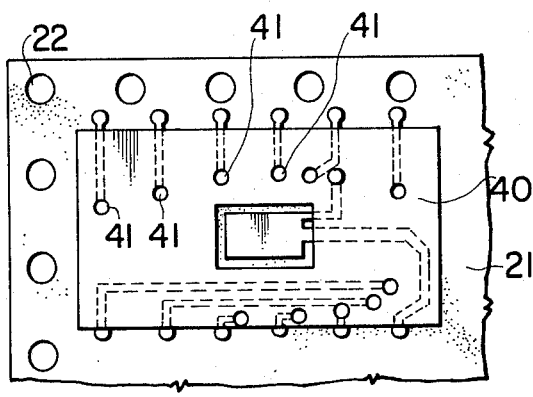

Referring to FIG. 8B, ceramic paste, which is prepared by the manner as described along with the steps (1) to (5′) and of the same composition as used for the formation of the foregoing green sheet 21, is printed to a thickness of about 60μ to 120μ on a selected area of the substrate 21 so as to cover the portions of the metal layers 23 to 35. The coated paste is then dried in air for about 5 minutes at a temperature of 100°C., thereby forming a green ceramic film 40. The green film 40 has openings to expose both ends of the metallic interconnection layers. Reference numerals 41 designate the portions on which the ceramic paste is not provided. In other words, the terminals of the metallic interconnection layers 23 to 35 are not covered with the alumina paste.

Figure 8C:
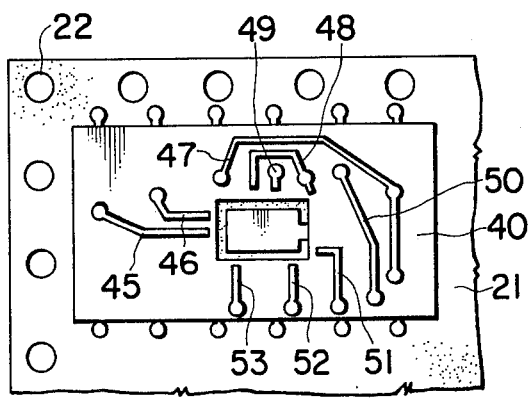

Referring to FIG. 8C, second metallic interconnection layers 45 to 53 are formed on selected surface areas of the green film 40, by printing the same conductive paste as the metallic layers 23 to 35 to a thickness of about 10μ to 20μ by well-known printing techniques, and then by heating the whole assembly in air for about 5 minutes at a temperature of 100°C. in order to dry the coated paste.

Figure 8D:
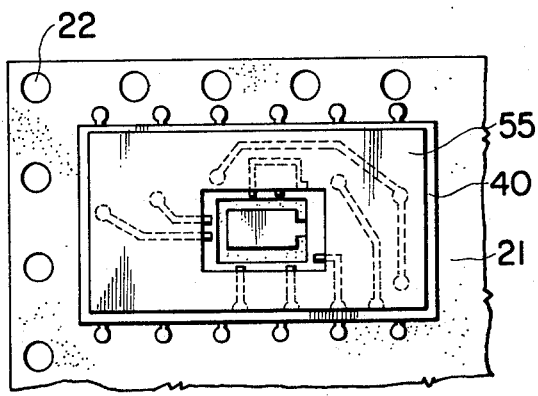

Referring to FIG. 8D, a green ceramic film 55 is formed by printing ceramic paste of the same material as that used for the film 40 to a thickness of about 0.1 mm so as to cover the green ceramic sheet 40 and the metallic layers 45 to 53 and then drying it in air for about 5 minutes at a temperature of 100°C. The green film 55 covers substantially the whole exposed surfaces of green film 40 and metallic layers 45 to 53 except portions occupied by each one end of the metallic interconnection layers 45, 46, 48, 49 and 51 to 53.

Figure 8E:
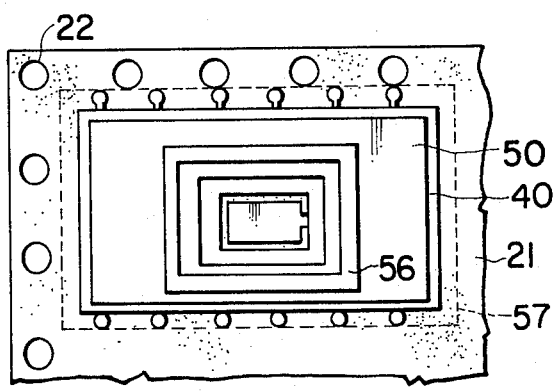

Then as shown in FIG. 8E, the conductive paste prepared along with the steps (1) to (5″) of FIG. 1 is again printed locally on the green film 55, and dried in air for about 5 minutes at a temperature of about 100°C., thereby forming a third metal layer 56.

The resulting printed structure is then cut as shown in the dotted line 57 in FIG. 8E. Then the structure is heated to a temperature of about 1,450°C. to 1,650°C. for about 8 to 10 hours in a reducing atmosphere containing $H_2$ and $N_2$ or in an inert atmosphere containing $N_2$ gas in order to sinter the ceramic and metallic materials, thereby obtaining a hard monolithic structure.

External leads are connected to the terminals of metallic interconnection layers 24 to 35 which are exposed along the edges of the substrate respectively in the same way as shown in FIGS. 5 to 7. Metal pad 23 and a metal cover is fixed to the metal layer 40 with a metal ring interposed therebetween in the same way as shown in FIGS. 5 to 7.

With the composite sintered structure thus obtained and comprising the ceramic sheet and the insulating layer (layers) and/or the metal layer (layers), the respective layers employ the materials from the same pulverization lot, and hence, especially the degrees of mixing are equal. In consequence, no variation is exhibited in the sintering temperature at the burning of the materials. Therefore, the coefficients of shrinkage agree perfectly, and products with quite no burning distortion and very high in the bonding strength between the conductor and the substrate are obtained.

Although, in the foregoing embodiments of the present invention, the sorts and the contained quantities of the inorganic ceramic material, binder, solvent, etc., are specified, it is needless to say that the invention can suitably modify the types as well as the proportions of the materials within a scope not departing from the appended claims.

What I claim is:

1. A method for manufacturing a composite sintered structure comprising the steps of
    a. preparing a mixture comprising an inorganic powdered ceramic material and a binder,
    b. forming a green ceramic sheet from said mixture,
    c. forming a green ceramic paste from said mixture,
    d. forming a conductor paste from said mixture by adding a powdery material of at least one metal thereto,
    wherein the ratio of the inorganic powdered ceramic material to the binder in the green ceramic sheet is equal to the ratio of the inorganic powdered ceramic material to the binder in each of said green ceramic paste and said conductor paste,
    e. printing a layer of said conductor paste on selected surface areas of said green ceramic sheet,
    f. locally printing a layer of said green ceramic paste on selected surface areas of said conductor paste and thereafter
    g. heating the resulting assembly to form a unitary body.

2. A method for manufacturing a composite sintered structure comprising the steps of
    a. preparing a mixture comprising an inorganic powdered ceramic material and a binder,
    b. forming a green ceramic sheet from said mixture,
    c. forming a green ceramic paste from said mixture,
    d. forming a conductor paste from said mixture by adding a powdery material of at least one metal thereto,
    wherein the ratio of the inorganic powdered ceramic material to the binder in the green ceramic sheet is equal to the ratio of the inorganic powdered ceramic material to the binder in each of said green ceramic paste and said conductor paste,
    e. printing a layer of said conductor paste on selected surface areas of said green ceramic sheet,
    f. locally printing a layer of said green ceramic paste on selected surface areas of said conductor paste and said green ceramic sheet,
    g. printing a second layer of said conductor paste on selected surface areas of the locally printed green ceramic paste, and
    h. thereafter, heating the resulting assembly of the printed layered green ceramic sheet to form a unitary body.

3. The method of claim 2, wherein said inorganic ceramic material contains alumina as the principal ingredient and including silica and magnesia to control the sintering temperature.

4. The method of claim 2, wherein said inorganic ceramic material contains from about 88 to about 95 weight percent of alumina and the balance consisting of silica and magnesia.

5. The method of claim 2, wherein said inorganic ceramic material contains 91 weight percent $Al_2O_3$, 6.8 weight percent of $SiO_2$, and 2.2 weight percent of MgO.

6. The method of claim 2, wherein said binder comprises polyvinyl butyral.

7. The method of claim 2, wherein said mixture also contains a solvent for said binder and a plasticizer.

8. The method of claim 7, wherein said solvent is a low-boiling point solvent.

9. The method of claim 2, wherein the mixture used to produce said pastes also contains a high-boiling point solvent for said binder, said solvent being one that is easy to print.

10. The method of claim 2, wherein the conductor paste powdery material is of at least one highly heat-resisting metal.

11. The method of claim 2, wherein the conductor paste contains from about 50 to 70 weight percent of said powdery material.

12. The method of claim 2, wherein said step (h) of heating the green ceramic sheet and the pastes is at about 1,450°C. to about 1,650°C. in a reducing or an inert atmosphere.

13. The method of claim 2, wherein said layer of green ceramic paste is thinner than said green ceramic sheet.

14. The method of claim 13, wherein said layer of green ceramic paste has a thickness of about 0.1 mm, and said green ceramic sheet has a thickness of about 0.5 to 1.2 mm.

15. The method of claim 13, wherein the first layer of conductor paste has a thickness of about $10\mu$ to $20\mu$, and said second layer of conductor paste has a thickness of about $20\mu$.

16. The method of claim 2, wherein said steps (e), (f) and (g) are repeated to form a multi-layer assembly.

17. The method of claim 2, further comprising the steps of placing a metal ring on said second layer of conductor paste, mounting a semiconductor chip on the first layer of conductor paste within said metal ring, connecting said semiconductor chip and first layer of conductor paste to external leads, and hermetically sealing said semiconductor chip within said metal ring by fixing a metal plate to said metal ring.

18. The method of claim 17, wherein said step of connecting to external leads includes soldering metal leads to said first layer of conductor paste connected with said semiconductor chip.

19. The method of claim 17, wherein the step of connecting to external leads includes applying a first metallic layer to said green ceramic sheet in contact with said first layer of conductor paste connected with said semiconductor chip, said first metallic layer extending over the side edges of said green ceramic sheet, applying a second metallic layer to the surface of said green ceramic sheet opposite to the paste layers, said second metallic layer being in contact with said first metallic layer, and connecting said external lead to said second metallic layer.

* * * * *